(12) United States Patent  
Slaughter

(10) Patent No.: US 6,395,595 B2  
(45) Date of Patent: May 28, 2002

(54) MULTI-LAYER TUNNELING DEVICE WITH A GRADED STOICHIOMETRY INSULATING LAYER

(75) Inventor: Jon Slaughter, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/894,368

(22) Filed: Jun. 27, 2001

Related U.S. Application Data

(62) Division of application No. 09/532,572, filed on Mar. 22, 2000, now Pat. No. 6,281,538.

(51) Int. Cl.⁷ ......................................... H01L 21/8242
(52) U.S. Cl. .................... 438/240; 438/592; 438/683; 428/116; 428/611; 360/320
(58) Field of Search ................. 438/240, 592, 438/683; 428/611, 161; 360/320

(56) References Cited

U.S. PATENT DOCUMENTS

| | | | | |
|---|---|---|---|---|
| 4,351,712 | A | | 9/1982 | Cuomo et al. ............... 204/192 |
| 5,907,784 | A | * | 5/1999 | Larson ......................... 438/592 |
| 5,998,040 | A | * | 12/1999 | Nakatani et al. ............. 428/611 |
| 6,004,654 | A | * | 12/1999 | Shinjo et al. ................. 428/161 |
| 6,188,549 | B1 | * | 2/2001 | Wiitala ......................... 360/320 |
| 6,281,538 | B1 | * | 8/2001 | Slaughter .................... 257/295 |

* cited by examiner

Primary Examiner—Vu A. Le  
Assistant Examiner—Pho Luu  
(74) Attorney, Agent, or Firm—William E. Koch

(57) ABSTRACT

An improved and novel multi-layer thin film device including a graded-stoichiometry insulating layer (16) and a method of fabricating a multi-layer thin film device including a graded-stoichiometry insulating layer (16). The device structure includes a substrate (12), a first electrode (14), a second electrode (18), and a graded-stoichiometry insulating, or tunnel-barrier, layer (16) formed between the first electrode (14) and the second electrode (18). The graded-stoichiometry insulating tunnel-barrier layer (16) includes graded stoichiometry to compensate for thickness profile and thereby produce a uniform tunnel-barrier resistance across the structure (10). In addition, included is a method of fabricating a multi-layer thin film device (10) including a graded-stoichiometry insulating tunnel-barrier layer (16) including the steps of providing (40) a substrate (12), depositing (44) a first electrode (14) on the substrate (12), depositing (46) a metal layer (21) on a surface of the first electrode (14), reacting (50; 52; or 54) the metal layer (21) to form a insulating tunnel-barrier layer with uniform tunneling resistance (16) by using a non-uniform reaction process (21) and depositing (56) a second electrode (18) on the uniform tunneling insulating layer (16).

12 Claims, 2 Drawing Sheets

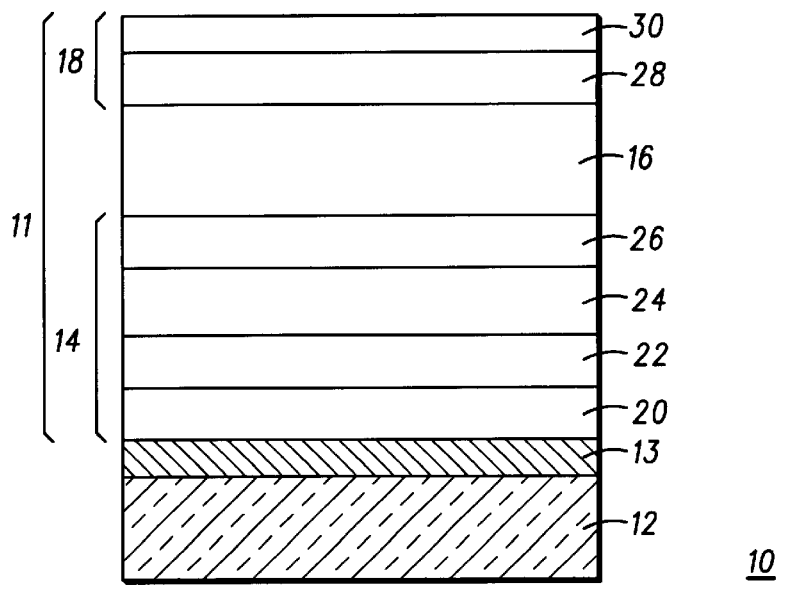
FIG. 1
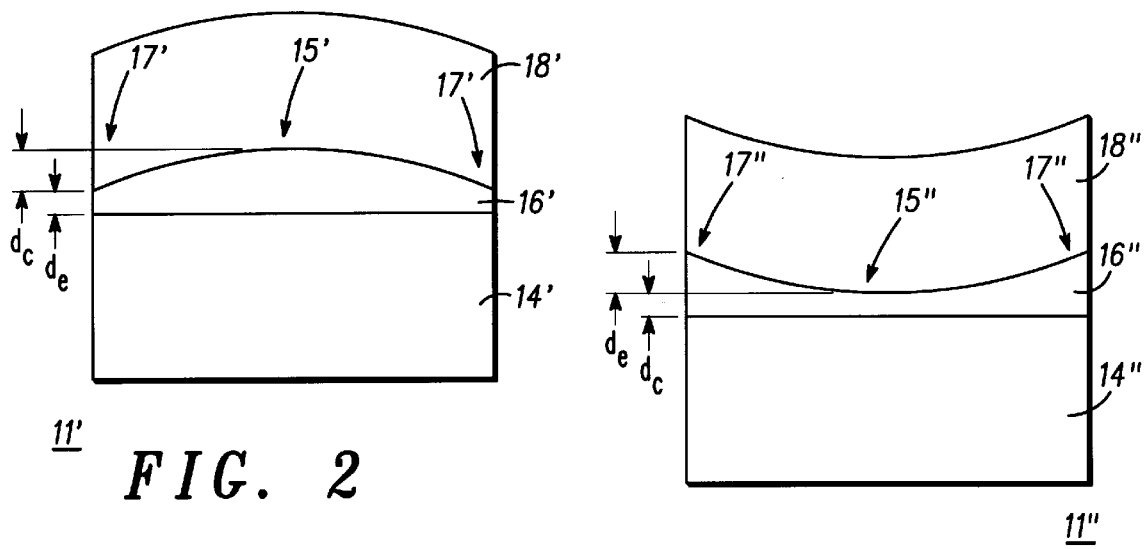
FIG. 2
FIG. 3
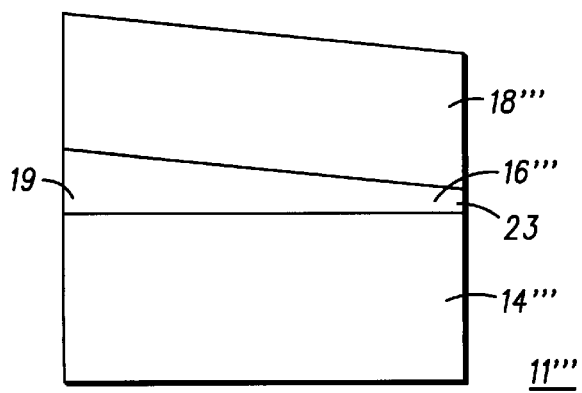
FIG. 4

MULTI-LAYER TUNNELING DEVICE WITH A GRADED STOICHIOMETRY INSULATING LAYER

The present application is based on a division of prior U.S. application No. 09/532,572, filed on Mar. 22, 2000, now U.S. Pat. No. 6,281,538, which is hereby incorporated by reference, and priority thereto for common subject matter is hereby claimed.

FIELD OF THE INVENTION

The present invention relates to a multi-layer thin film device including an insulating layer, and more particularly to the inclusion of a graded-stoichiometry insulating layer.

BACKGROUND OF THE INVENTION

Typically, a magnetic element, such as a magnetic memory element, includes a multi-layer thin film structure including ferromagnetic layers separated by a non-magnetic layer, hereinafter referred to as an insulating tunnel barrier, or barrier, layer. Information is stored in the magnetic layers as directions of magnetization vectors. Magnetic vectors in one magnetic layer, for instance, are magnetically fixed or pinned, while the magnetization direction of the other magnetic layer is free to switch in an applied field between the same and opposite directions that are called "parallel" and "antiparallel" states, respectively. In response to parallel and antiparallel states, the magnetic memory element represents two different resistances. The resistance has minimum and maximum values when the magnetization vectors of the two magnetic layers point in substantially the same and opposite directions, respectively. Accordingly, a detection of change in resistance allows a device, such as an MRAM device, to provide information stored in the magnetic memory element. The difference between the minimum and maximum resistance values, divided by the minimum resistance is known as the magnetoresistance ratio (MR).

Thin film structures of this type, more particularly magnetic tunnel junction elements, structurally include very thin layers, some of which are tens of angstroms thick. Of present concern is the fabrication of the insulating tunnel barrier, or barrier, layer formed between the ferromagnetic layers. The junction resistance varies approximately exponentially with the thickness of the barrier layer. This strong dependence on thickness makes it very difficult to produce devices with nearly the same resistance over typical substrate sizes used in manufacturing.

There are currently four common methods for forming insulating tunnel barrier layers made of aluminum oxide: a) natural oxidation of aluminum (Al) metal; b) ultraviolet (UV) assisted oxidation of aluminum (Al) metal; c) plasma oxidation of aluminum (Al) metal; and d) reactive sputtering of aluminum oxide. It should be understood that while aluminum oxide is disclosed as forming the insulative tunnel barrier, other materials which include insulative properties are anticipated by this disclosure, including, aluminum nitride, tantalum oxide, tantalum nitride, or the like.

The oldest method of forming an insulating tunnel barrier layer is through natural oxidation. Initially a layer of metal, such as aluminum (Al), is deposited on an electrode which is on some type of substrate. The aluminum is exposed to oxygen or air for a period of time, typically a number of hours. This exposure to oxygen or air causes the aluminum to oxidize and form an aluminum oxide layer. Subsequently the tunnel junction structure is completed by forming on top of the insulating layer the remaining electrode, ferromagnetic layers, or the like, dependent upon the type of device being formed.

One problem that exists with this type of device is that the initial depositing of the metal, here aluminum (Al), is non-uniform in thickness, and accordingly resultant differences in tunneling resistance across the layer occur. In addition, this method has been found to be very slow and there is limited flexibility in controlling the resistance of the formed insulating layer. As a result the resistance tends to be very low. Natural oxidation assisted by exposure to ultraviolet light is faster and potentially more controllable.

An alternative method for forming an insulating tunnel barrier layer, or insulating layer, is through plasma oxidation. During this process, aluminum is deposited onto a substrate and is subsequently oxidized with oxygen plasma, such as from an oxygen glow discharge, similar to neon plasma in a neon light. In general, this type of technique is hard to control and does not render a uniform thickness, thus resistance, across the substrate due to the lack of control exhibited over the oxygen discharge. Alternatively, an oxygen plasma source is utilized to oxidize the aluminum. This method provides for the control of resistance over a wide range and typically high magneto-resistance values are achieved. This method is generally similar to the previously described method utilizing a plasma discharge, yet more control can be exercised.

Yet another alternative method for forming an insulating tunnel barrier layer is reactive sputtering. During this process, aluminum is deposited, utilizing reactive sputtering, onto a substrate surface in an oxygen atmosphere. The aluminum reacts with the oxygen enclosed within the vacuum chamber to form aluminum oxide. Typically, results tend to exhibit high resistance and the end product is not uniform in thickness across the substrate leading to variations in resistance levels.

Other, less common, methods of producing insulating layers have been reported. A method similar to the plasma oxidation method is the oxygen beam method, deposition of an aluminum layer followed by exposure to an oxygen beam. The beam can be, for example, a low-energy oxygen ion beam or a low-energy atomic oxygen beam. A technique similar to reactive sputtering is sputter deposition from a compound target. This can be used with or without the addition of extra oxygen into the sputtering ambient, with or without an oxygen ion assist beam, or with or without an extra oxidation step after deposition.

Generally, while these four methods have been found to be useful for the fabrication of tunnel barrier insulating layers, uniformity of junction resistance over large wafer sizes used in semiconductor manufacturing, 150 mm to 300 mm diameter, has not been demonstrated. The resistance of the MTJ material, usually expressed as the resistance-area product (RA), has been shown to vary exponentially with both the metal layer thickness and oxidation dose for thickness and dose values that produce high MR. For example, a variation in aluminum thickness of only 5% can result in a variation in RA of over 30%. This strong dependence on the thickness and oxidation dose makes it very difficult to obtain high uniformity of RA. However, by adjusting the aluminum thickness profile and oxidation profile to offset each other, a resultant barrier layer with a small variation in thickness which is compensated for by a variation in the composition of the material provides for a uniform RA over the area of a substrate.

Accordingly, it is an object of the present invention to provide for a multi-layer thin film structure that includes an insulating layer having graded stoichiometry to compensate for the thickness profile and produce a uniform tunneling resistance across the insulating layer, more particularly, across the entire wafer structure as fabricated.

It is another object of the present invention to provide for a graded-stoichiometry insulating layer and method of fabricating the layer, for use in multi-layer thin film structures.

It is yet another purpose of the present invention to provide for a graded-stoichiometry insulating layer and method of fabricating the layer that includes precise control of the stoichiometry of the resultant layer, thus uniformity of device resistance across the substrate area.

It is another purpose of the present invention to provide for a graded-stoichiometry insulating layer and method of fabricating the layer that provides for uniformity of the resistance-area product in tunnel junction material.

It is still another purpose of the present invention to provide for a graded-stoichiometry insulating layer and method of fabricating the layer that includes the control of the lateral profile of the oxidation process, thus resistance of the resultant insulating tunnel barrier layer.

It is still a further purpose of the present invention to provide for a laterally-graded-stoichiometry insulating layer and method of fabricating the layer that is amenable to high throughput manufacturing.

SUMMARY OF THE INVENTION

These needs and others are substantially met through provision of a multi-layer thin film structure including a graded-stoichiometry insulating layer and a method of fabricating a multi-layer thin film structure including a graded-stoichiometry insulating layer. The structure includes a substrate, a first electrode, a second electrode, and a graded-stoichiometry insulating, or barrier, layer formed between the first electrode and the second electrode. The insulating layer includes laterally graded stoichiometry to compensate for its thickness profile and thereby produce uniform tunneling barrier resistance across the structure. In addition, disclosed is a method of fabricating a multi-layer thin film structure including a graded-stoichiometry insulating layer including the steps of providing a substrate, depositing a first electrode on the substrate, depositing a metal layer on a surface of the first electrode, causing the metal layer to react to form a insulating layer with uniform RA by grading the stoichiometry of the metal layer, and depositing a second electrode on the uniform insulating layer.

BRIEF DESCRIPTION OF THE DRAWINGS

FIG. 1 illustrates a cross-sectional view of a first embodiment of a complete multi-layer thin film structure formed according to the method of the present invention;

FIG. 2 illustrates an enlarged cross-sectional view of a graded-stoichiometry barrier layer, formed according to the present invention;

FIG. 3 illustrates an enlarged cross-sectional view of a graded-stoichiometry barrier layer, formed according to the present invention;

FIG. 4 illustrates an enlarged cross-sectional view of a graded-stoichiometry barrier layer, formed according to the present invention.

DETAILED DESCRIPTION OF THE PREFERRED EMBODIMENTS

Figure 5:
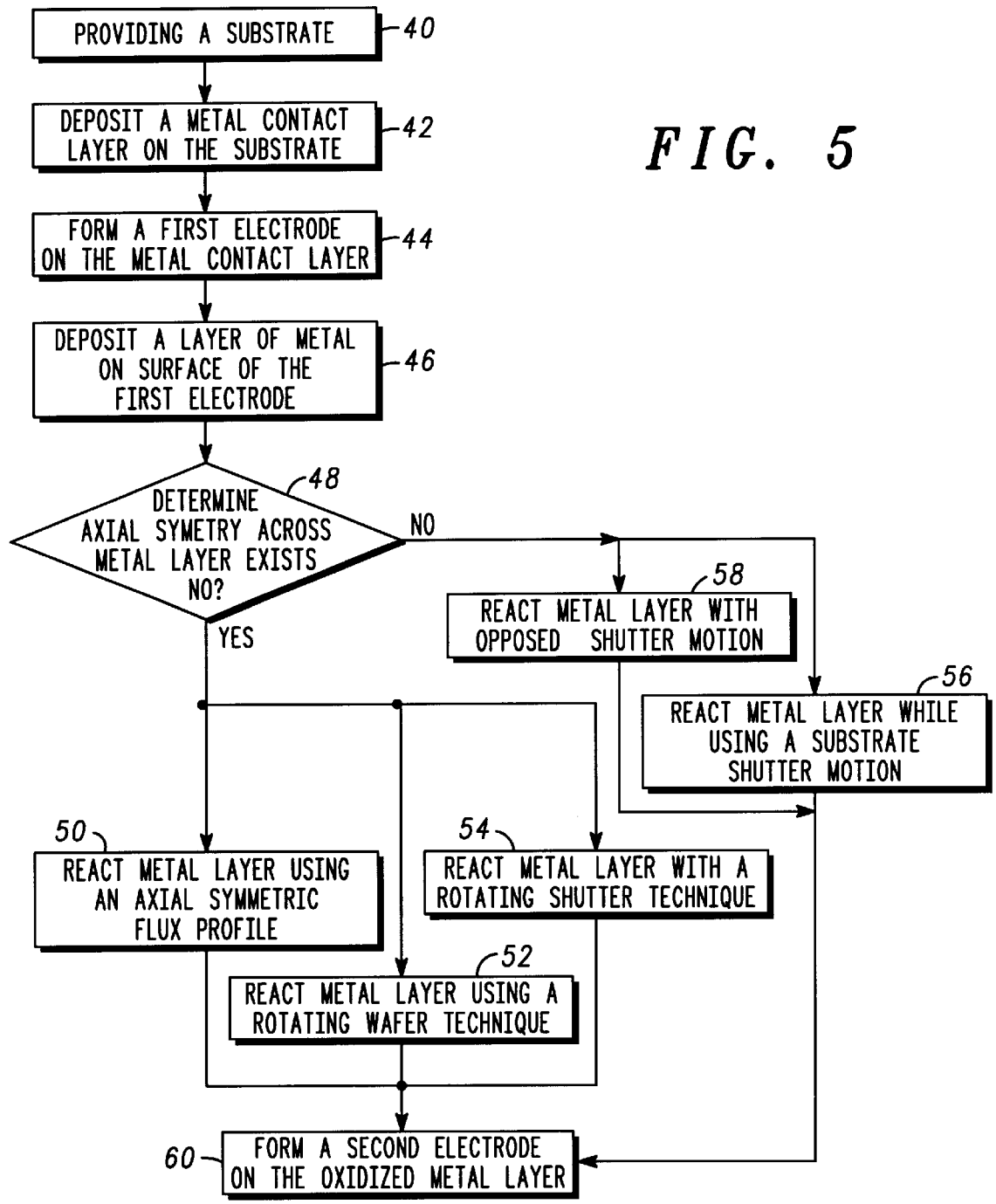
FIG. 5 illustrates in a flow chart diagram, the method of forming a graded-stoichiometry insulating layer according to the present invention.

During the course of this description, like numbers are used to identify like elements according to the different figures that illustrate the invention. Accordingly, FIG. 1 illustrates in cross-sectional view a first embodiment of a multi-layer thin film structure, more particularly a magnetic element, formed according to the method of the present invention. More specifically, illustrated in FIG. 1, is a fully patterned magnetic element structure, generally referenced 10. Structure 10 includes a substrate 12, a base electrode multilayer stack 14, an insulating spacer, or barrier layer, 16 including oxidized aluminum, and a top electrode multilayer stack 18. Base electrode multilayer stack 14 and top electrode multilayer stack 18 include ferromagnetic layers. Base electrode layers 14 are formed on a metal lead, or contact layer, 13, which is formed on a substrate 12. Base electrode layers 14 include a first seed layer 20, deposited on metal lead 13, a template layer 22, a layer of antiferromagnetic pinning structure 24, and a fixed ferromagnetic layer 26 formed on and exchange coupled with the underlying antiferromagnetic pinning structure 24. Ferromagnetic layer 26 is described as fixed, or pinned, in that its magnetic moment is prevented from rotation in the presence of an applied magnetic field up to a certain strength. Ferromagnetic layer 26 is typically formed of alloys of one or more of the following: nickel (Ni), iron (Fe), and cobalt (Co) and includes a top surface. Top electrode stack 18 includes a free ferromagnetic layer 28 and a protective layer 30. The magnetic moment of the free ferromagnetic layer 28 is not fixed, or pinned, by exchange coupling, and is free to rotate in the presence of a sufficient applied magnetic field. Free ferromagnetic layer 28 is typically formed of alloys of one or more of the following: nickel (Ni), iron (Fe), and cobalt (Co). It should be understood that a reversed, or flipped, structure is anticipated by this disclosure. More particularly, it is anticipated that the magnetic element formed by the method disclosed herein can include a top fixed, or pinned layer, and thus described as a resultant top pinned structure.

Referring now to FIGS. 2–4, illustrated in enlarged cross-sectional views are three embodiments showing the formation of insulating barrier layer 16. More particularly, illustrated in each drawing is a portion of device 10. It should be noted that all components of FIG. 1 that are similar to components of the FIGS. 2–4, are designated with similar numbers, having a single prime, double prime, or triple prime added to indicate the different embodiments. Referring now to FIG. 2, illustrated in enlarged cross-sectional view is a structure, generally similar to portion 11 of FIG. 1, illustrating a portion of a thin film structure, referenced 11'. Similar to the structure described with regard to FIG. 1, this structure includes a first electrode 14', a second electrode 18' and an insulating barrier layer 16'. In this first embodiment, shown is insulating barrier layer 16' formed having a central aspect 15' with a central thickness of $d_c$ and two opposed edges, referenced 17', with edge thicknesses of $d_e$ which is lesser than thickness $d_c$. As disclosed, in this particular embodiment, barrier layer 16' is formed by depositing a layer of aluminum (Al) (not shown) onto first electrode 14'. During the deposition process, the layer has included a variation in thickness across the wafer. As illustrated in FIG. 2, the layer of aluminum has a thickness variation whereby the central most aspect 15' of the wafer is thicker in relation to the outer edges 17'. An axially symmetric thickness profile of this kind is typical of films deposited onto a rotating substrate. This difference in thickness, results in a variance in resistance across the wafer, once the layer is oxidized to form resultant oxidized layer 16'.

Referring now to FIG. 3, illustrated is a portion 11" of a device, generally similar to the embodiment described with reference to FIG. 2, except in this particular embodiment a central most aspect 15" of oxidized layer 16", having a thickness of $d_c$, is the thinnest and the outer edges 17" of layer 16", having a thickness $d_e$, are the thicker. As previously stated, this difference in thickness, results in a variance in resistance across the wafer once the deposited metal layer is oxidized to form resultant oxidized layer 16".

Referring now to FIG. 4, illustrated is a portion 11''' of a device, generally similar to the embodiment described with reference to FIGS. 2 and 3, except in this particular embodiment, layer 16''' is formed having a wedge-shaped formation across the wafer. More particularly, the thinnest aspect of layer 16''' is formed at one edge 19 of the wafer, and the thickest aspect of layer 16''' is formed at an opposed edge 23. This type of fabrication is typically found where shutter motion during deposition produces a thickness variation across the wafer from edge 19 to opposed edge 23. As previously stated, this difference in thickness, results in a variance in resistance across the wafer, once the deposited metal layer is oxidized to form resultant oxidized layer 16'''.

As illustrated in FIG. 5, by flow chart diagram, the method of fabricating device 10 includes the steps of providing 40 substrate 12, and depositing 42 on an uppermost surface of substrate 12, metal lead 13. Metal lead 13 is deposited utilizing standard deposition techniques well known in the art. Next, first electrode 14 is formed by depositing 44 seed layer 20, template layer 22, antiferromagnetic pinning structure layer 24, and fixed ferromagnetic layer 26 on an uppermost surface of metal lead 13 utilizing standard deposition techniques well known in the art. Next, a layer of metal 21 is deposited 46 on first electrode 14 utilizing sputtering techniques well known in the art. Next, it must be determined 48 if metal layer 21 is axially symmetric over the wafer area, as illustrated in FIGS. 2 and 3, or non-axially symmetric over the wafer area, as illustrated in FIG. 4. If axial symmetry exists, then layer 21 is oxidized utilizing an axially symmetric method, such as by using an axial symmetric flux profile 50, a rotating wafer technique 52, or a rotating shutter technique 54 to form oxidized insulating layer 16.

Ion sources typically produce beams with axially symmetric current distributions. During ion beam oxidation, the thickness across metal layer 21 is compensated for by choosing an appropriate hole pattern in the grids utilized in an ion beam source. In the instance where the thickness of metal layer 21 is greatest in the central most aspect, as illustrated in FIG. 2, then the grids are chosen to allow for a greater beam current density toward the edges. In this instance, the oxidized film becomes more oxygen rich with increasing radius to compensate for the thickness variation. The result is a barrier, more particularly oxidized layer 16, with a small variation in thickness which is compensated for by a variation in the composition, or stoichiometry, of the oxidized aluminum 16, or other oxidized metal, to provide for a uniform resistance-area product. It should be understood that a variation to compensate for a greater thickness toward the edges 17", as illustrated in FIG. 3, is anticipated by this disclosure. In this instance, grid choice would allow for a greater beam current in the central most aspect 15", thereby causing the central aspect 15" to become more oxygen rich than the edges 17", and thus compensating for the thickness variation. During ion beam exposure, layer of metal 21, deposited on the first electrode is exposed to a low energy oxygen ion beam (<200 eV) and oxidized. This oxidation of layer 21 provides for the formation of a thin insulating tunneling layer 16 of aluminum oxide. It should be understood that insulating layer 16 can be formed by exposing the metal to a nitrogen beam, thereby forming, for example, aluminum nitride. During operation, the ion beam voltage and current determine the oxidation rate. The profile of the ion beam can be adjusted to achieve the desired uniformity of oxidation of metal layer 21. As previously stated, the uniformity of the resultant layer 16 can be fine-tuned by adjusting the profile of the beam with the series of grids, dependent upon grid design. A larger diameter hole or a higher density of holes can be used to increase the beam current density in areas as desired. The grids are formed to provide for compensation in metal layer 21 thickness variations. For example, the grids can be formed to allow for greater oxidation of layer 21 about the perimeter where the thickness is less. This provides for a greater flux of oxygen, thus greater oxidation of this perimeter aspect and uniformity of resistance across the resultant insulating layer 16.

An alternative method to address the thickness variation in an axially symmetric structure is with plasma oxidation. In this instance, the aluminum thickness profile and plasma density profile are adjusted to offset each other. The result is a barrier, or insulating tunneling layer, with a small variation in thickness which is compensated for by a variation in the composition of the oxidized aluminum to provide for a uniform resistance-area product. During plasma oxidation, the plasma geometry is adjusted to allow for higher plasma density across the thinnest aspect of metal layer 21. The plasma geometry can be adjusted in several ways, including; (a) arrangement of the electrodes or coils that excite the plasma, (b) placement of baffles or slits between the plasma and the substrate, or (c) electrodes that direct the ions in the plasma.

Accordingly, for a device structure similar to that illustrated in FIG. 2, having the thickest aspect in a central portion 15", the plasma density is adjusted to allow for a higher plasma density about the edges 17", thus edge heavy oxidation. Where the thickest aspect of the metal layer is about the edges 17", the plasma density is adjusted to allow for a higher plasma density at a central aspect 15", thus center heavy oxidation. This adjustment of the plasma density provides for a resultant change in the stoichiometry of oxidized layer 16", without a physical correction in layer thickness.

Other techniques with axial symmetry, such as UV assisted oxidation with optics that produce an axially symmetric light intensity profile, also can be used to produce the necessary graded stoichiometry. While undergoing oxidation by any technique, three typical techniques are used: the flux profile may be axial symmetric with or without the need for rotating the substrate, the wafer may be rotated with or without an axial symmetric source, or a shutter may be rotated between the source and the wafer with or without an axial symmetric source to ensure that the average oxidation profile is axially symmetric.

Finally, where axial symmetry does not exist, more specifically, layer 21 has some thickness gradient that does not have axial symmetry, as illustrated in FIG. 4, metal layer 21 is oxidized with an opposed shutter motion 56 that produces a longer exposure for the thinner areas of layer 21, or a substrate sweeping motion 58 thereby achieving a resultant graded stoichiometry across oxidized layer 16, and uniform resistance. Once proper oxidation of layer 21, with resultant oxidized layer 16, a second electrode 18 is formed 60 on oxidized layer 16.

During fabrication of insulating layer 16, sputtering of a metal material onto first electrode 14 is typically done within a chamber. The chamber is of the type typically used in the art and is under a vacuum pressure. The vacuum chamber has located within, a sputtering tool for deposition of the plurality of thin film layers. During fabrication of device 10, substrate 12, having formed thereon first electrode 14 is positioned within the chamber to allow for the sputtering of a metal film 21 upon the surface of substrate 12, more particularly first electrode 14. Metal layer 21 is typically formed between 5–15 Å thick. Once the sputtering of metal film 21 is complete, the substrate 12 having formed thereon the plurality of thin films, is positioned to allow for the exposing of metal film 21 to achieve oxidation, dependent upon the existence of axial, or non-axial, symmetry. It should be understood that while this method of fabricating a thin, uniform insulating layer 16 is described with reference to the fabrication of a magnetic element 10, it is anticipated that it can be used in all instances where the fabrication of a thin insulating layer with uniform properties is desired in a multi-layer thin film structure.

Thus, an insulating tunneling layer, having a graded stoichiometry across the layer and thus uniform resistance across the layer and a method of fabricating the layer is described that provides for a more manufacturable device and process of making the device, while remaining cost effective. As disclosed, this technique can be utilized during the fabrication of MRAM bits and magnetic field sensors as in hard disk heads. In addition, the technique can be utilized during the fabrication of any multi-layer thin film structure which includes thin insulating layers such as those found in x-ray of EUV mirrors. Accordingly, such instances are intended to be covered by this disclosure

What is claimed is:

1. A method of fabricating a multi-layer thin film structure comprising the steps of:
   providing a substrate having a surface;
   forming a first electrode on the surface of the substrate, the first electrode having a top surface and a bottom surface;
   forming a metal layer on the top surface of the first electrode;
   reacting the metal layer to form a graded-stoichiometry insulating tunnel-barrier layer having a top surface, a uniform tunneling resistance across the layer, and a lateral composition gradient to compensate for an initial material thickness gradient; and
   forming a second electrode on the top surface of the graded-stoichiometry insulating tunnel-barrier layer.

2. A method of fabricating a multi-layer thin film structure as claimed in claim 1, wherein the step of forming a metal layer on a top surface of the first electrode, includes an aluminum material.

3. A method of fabricating a multi-layer thin film structure as claimed in claim 1, wherein the step of forming a metal layer on a top surface of the first electrode, includes a tantalum material.

4. A method of fabricating a multi-layer thin film structure as claimed in claim 1, wherein the step of reacting the metal layer to form a graded-stoichiometry insulating tunnel-barrier layer includes exposure to an ion beam having a non-uniform beam current profile.

5. A method of fabricating a multi-layer thin film structure as claimed in claim 1, wherein the step of reacting the metal layer to form a graded-stoichiometry insulating tunnel-barrier layer includes exposure to a plasma having a non-uniform density.

6. A method of fabricating a multi-layer thin film structure as claimed in claim 1, wherein the step of reacting the metal layer to form a graded-stoichiometry insulating tunnel-barrier layer includes a shutter motion that exposes one area of the layer for a greater period of time than remaining areas of the layer.

7. A method of fabricating a multi-layer thin film structure as claimed in claim 1, wherein the step of reacting the metal layer to form a graded-stoichiometry insulating tunnel-barrier layer includes edge heavy reaction.

8. A method of fabricating a multi-layer thin film structure as claimed in claim 1, wherein the step of reacting the metal layer to form a graded-stoichiometry insulating tunneling layer includes heavy reacting at a central aspect.

9. A method of fabricating a multi-layer thin film structure as claimed in claim 1, wherein the step of reacting the metal layer to form a graded-stoichiometry insulating tunnel-barrier layer includes exposure to an atomic beam having a non-uniform beam flux profile.

10. A method of fabricating a multi-layer thin film structure as claimed in claim 1, wherein the step of reacting the metal layer to form a graded-stoichiometry insulating tunnel-barrier layer includes exposure to an ultra-violet light having a non-uniform intensity profile.

11. A method of fabricating a multi-layer thin film structure as claimed in claim 1, wherein the step of reacting the metal layer to form a graded-stoichiometry insulating tunnel-barrier layer includes reacting the metal layer with oxygen to form the insulating tunnel-barrier layer.

12. A method of fabricating a multi-layer thin film structure as claimed in claim 1, wherein the step of reacting the metal layer to form a graded-stoichiometry insulating tunnel-barrier layer includes reacting the metal layer with nitrogen to form the insulating tunnel-barrier layer.

* * * * *

UNITED STATES PATENT AND TRADEMARK OFFICE
CERTIFICATE OF CORRECTION

PATENT NO. : 6,395,595 B2
DATED : May 28, 2002
INVENTOR(S) : Slaughter

It is certified that error appears in the above-identified patent and that said Letters Patent is hereby corrected as shown below:

<u>Column 1,</u>
Line 4, please add the following paragraph:
-- This invention was made with Government support under Agreement No. MDA972-96-3-0016 awarded by DARPA. The Government has certain rights in the invention. --

Signed and Sealed this

Fourth Day of November, 2003

JAMES E. ROGAN
*Director of the United States Patent and Trademark Office*